United States Patent [19]
Taki et al.

[11] Patent Number: 5,225,684
[45] Date of Patent: Jul. 6, 1993

[54] CHARGED PARTICLE BEAM EXPOSURE APPARATUS CONTROL SYSTEM AND A METHOD OF OPERATION FOR PROVIDING A DRAWING START SIGNAL

[75] Inventors: Kazutaka Taki; Hiroshi Yasuda; Junichi Kai; Atsushi Saito; Kiichi Sakamoto, all of Kawasaki, Japan

[73] Assignee: Fujitsu Limited, Kawasaki, Japan

[21] Appl. No.: 948,475

[22] Filed: Sep. 22, 1992

Related U.S. Application Data

[63] Continuation of Ser. No. 762,778, Sep. 20, 1991, abandoned.

Foreign Application Priority Data

Sep. 20, 1990 [JP] Japan ................... 2-251110

[51] Int. Cl.⁵ ............................................. H01J 37/30
[52] U.S. Cl. ................................. 250/492.2; 250/398
[58] Field of Search .......... 250/492.2, 492.21, 492.22, 250/492.3, 492.1, 398, 400

[56] References Cited

U.S. PATENT DOCUMENTS

| 4,853,870 | 8/1989 | Yasutake et al. | 250/396 R |
| 4,924,257 | 5/1990 | Jain | 355/53 |
| 4,937,458 | 6/1990 | Fujikura | 250/492.2 |

Primary Examiner—Jack I. Berman
Assistant Examiner—Jim Beyer
Attorney, Agent, or Firm—Staas & Halsey

[57] ABSTRACT

A charged particle beam exposure system emits and deflects an electron beam (11a) toward a continuously moving exposure object (18) and draws semiconductor integrated circuit patterns on the object. The system comprises a charged particle beam generating unit (11), first and second deflectors (12 and 13) for deflecting the electron beam (11a), first and second deflector drivers (14 and 15) for controlling outputs of the first and second deflectors (12 and 13), a stage driving and controlling unit (16) for controlling the movement of the object (18), and a controller (17) for controlling the inputs and outputs of the respective components. The second deflector driver (15) comprises at least a data correction unit (15A) for receiving main deflector data (MD1) and stage position data (STD) and providing corrected main deflector data (MD2), a deflection signal output unit (15B) for providing a main deflector set signal (S1) according to the main deflector data (MD2), a first wait time generator (15C) for generating a first pulse signal (PS1) according to the main deflector data (MD2), a second wait time generator (15D) for generating a second pulse signal (PS2) in synchronism with the first pulse signal (PS1), and a comparator (15E) for comparing the first and second pulse signals (PS1 and PS2) with each other and providing a drawing start signal (S3).

9 Claims, 11 Drawing Sheets

CHARGED PARTICLE BEAM EXPOSURE APPARATUS CONTROL SYSTEM AND A METHOD OF OPERATION FOR PROVIDING A DRAWING START SIGNAL

This application is a continuation of application Ser. No. 07/762,778, filed Sep. 20, 1991, now abandoned.

BACKGROUND OF THE INVENTION

1. Field of the Invention

The present invention relates to a charged particle beam exposure system and a method of controlling the system, and particularly to a system for emitting and deflecting an electron beam toward an object to draw semiconductor integrated circuit patterns on the object placed on a stage that is continuously moved, and a method of controlling the system.

2. Description of the Related Art

To densely integrate LSIs on a chip, fine LSI patterns are frequently drawn by using, instead of a photolithography technique, an exposure technique employing charged particle beams such as electron beams and X ray beams.

To improve the speed and efficiency of the pattern drawing, a continuously moving stage exposure method has been developed. This method continuously moves a stage on which an object to be exposed is placed. When shifting an electron beam between main exposure regions on the object, the method activates an electromagnetic deflector is activated to electromagnetically deflect the electron beam, and when drawing patterns in each subregion, an electrostatic deflector is activated to electrostatically deflect the electron beam.

In shifting the electron beam between the regions, it takes time to stabilize a main deflector amplifier due to inductance of the electromagnetic deflector. It is necessary, therefore, to set a predetermined wait time depending on a jump quantity of the electron beam between the regions before starting the pattern drawing with the electron beam.

Unlike a conventional step-and-repeat exposure method, the continuously moving stage exposure method periodically reads a stage position and feeds the read data back to a deflection processing system. Accordingly, it may happen that the stage position is read just before the elapse of the wait time to destabilize the electromagnetic deflector even after the wait time. This may fluctuate the pattern drawing and thus deteriorate the reliability of the exposure system.

It is required, therefore, to provide a system and a method that correctly starts drawing patterns in response to not only the wait time for stabilizing the electromagnetic deflector but also another wait time related to a period of reading and controlling the stage position, to improve the reliability of the continuously moving stage exposure method.

Figure 4A:
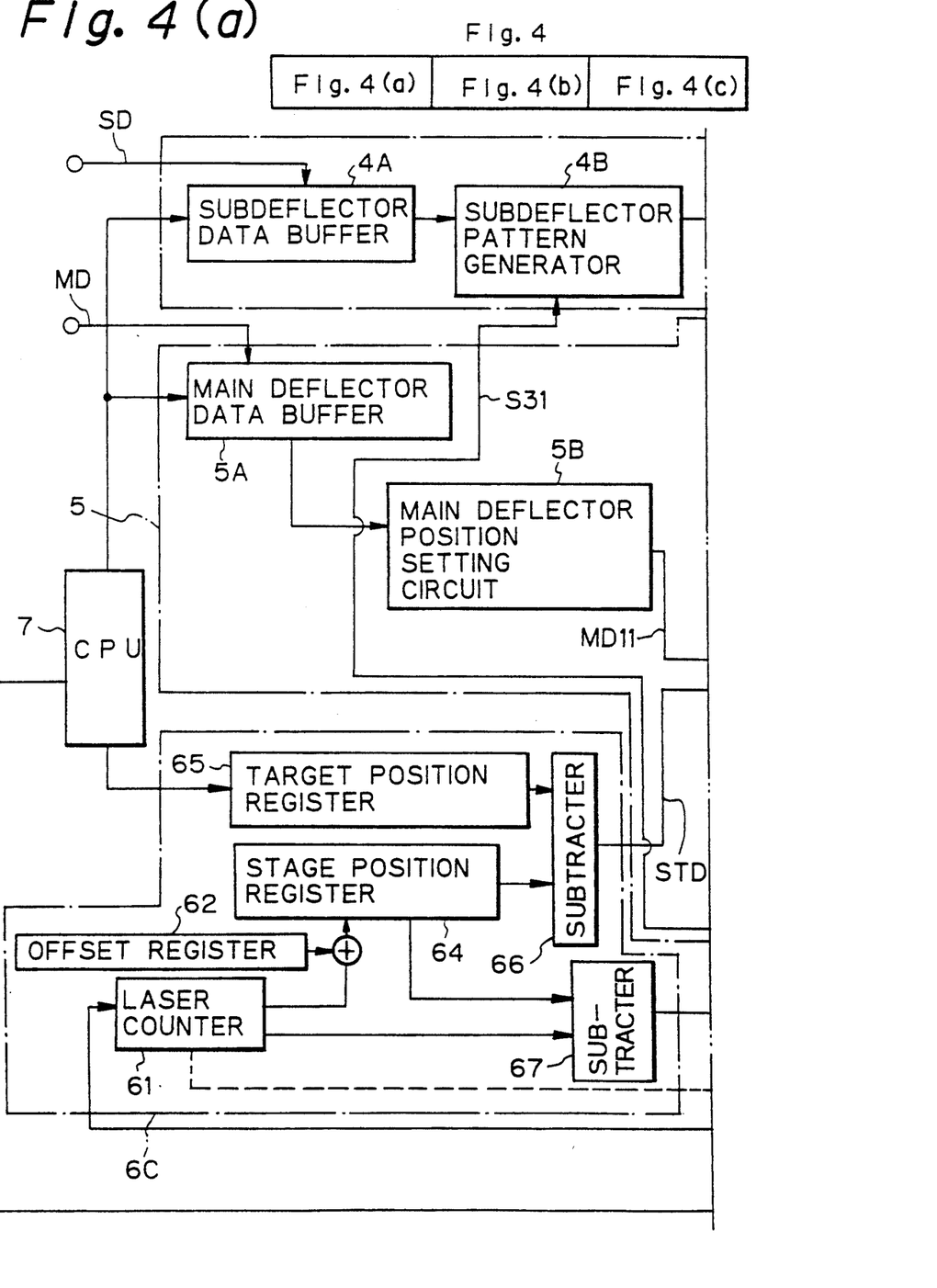
FIG. 4(a) to 4(c) are in the composite a block diagram of an electron beam exposure system according to a prior art.
Figure 4B:
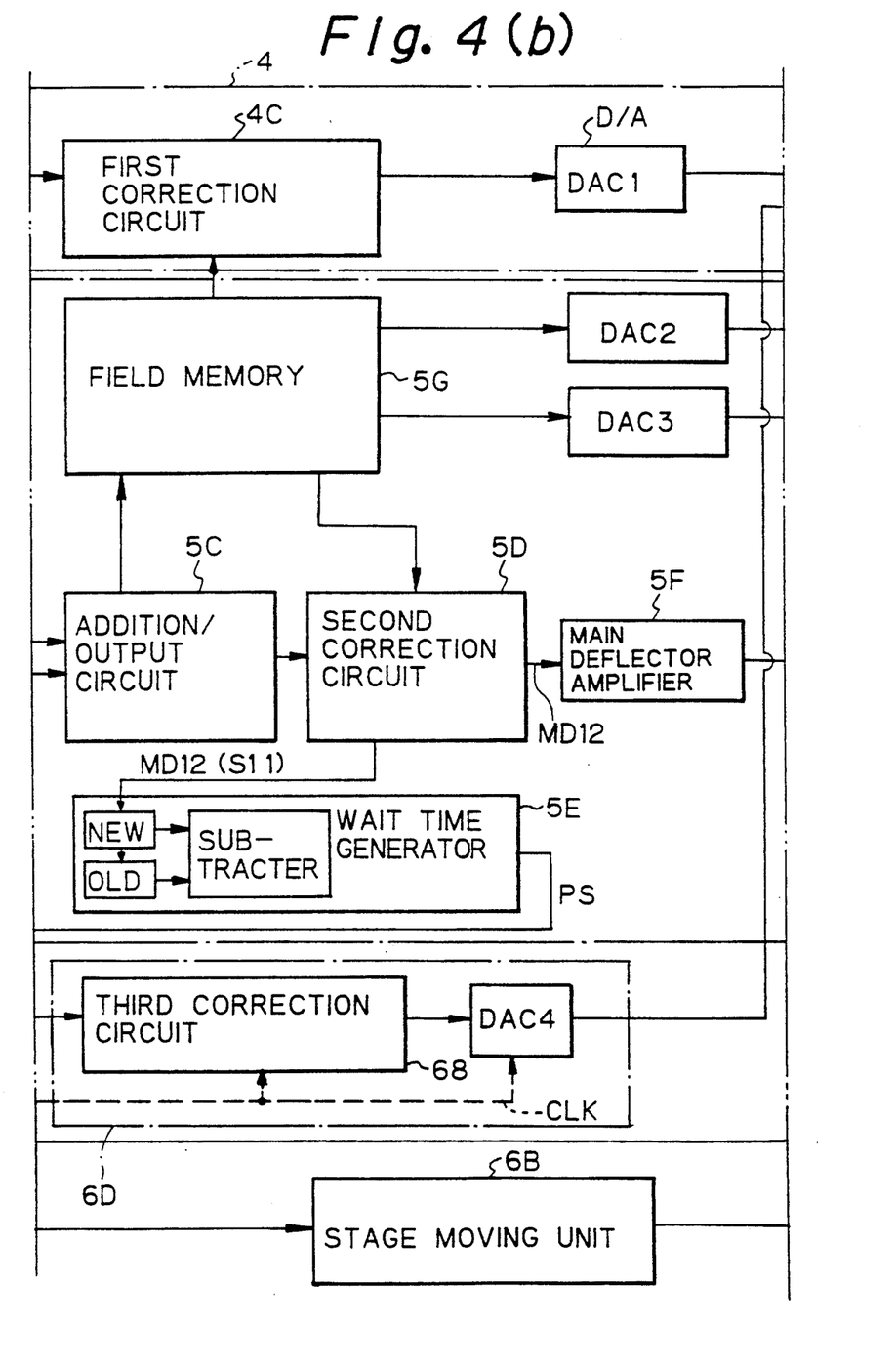
Figure 4C:
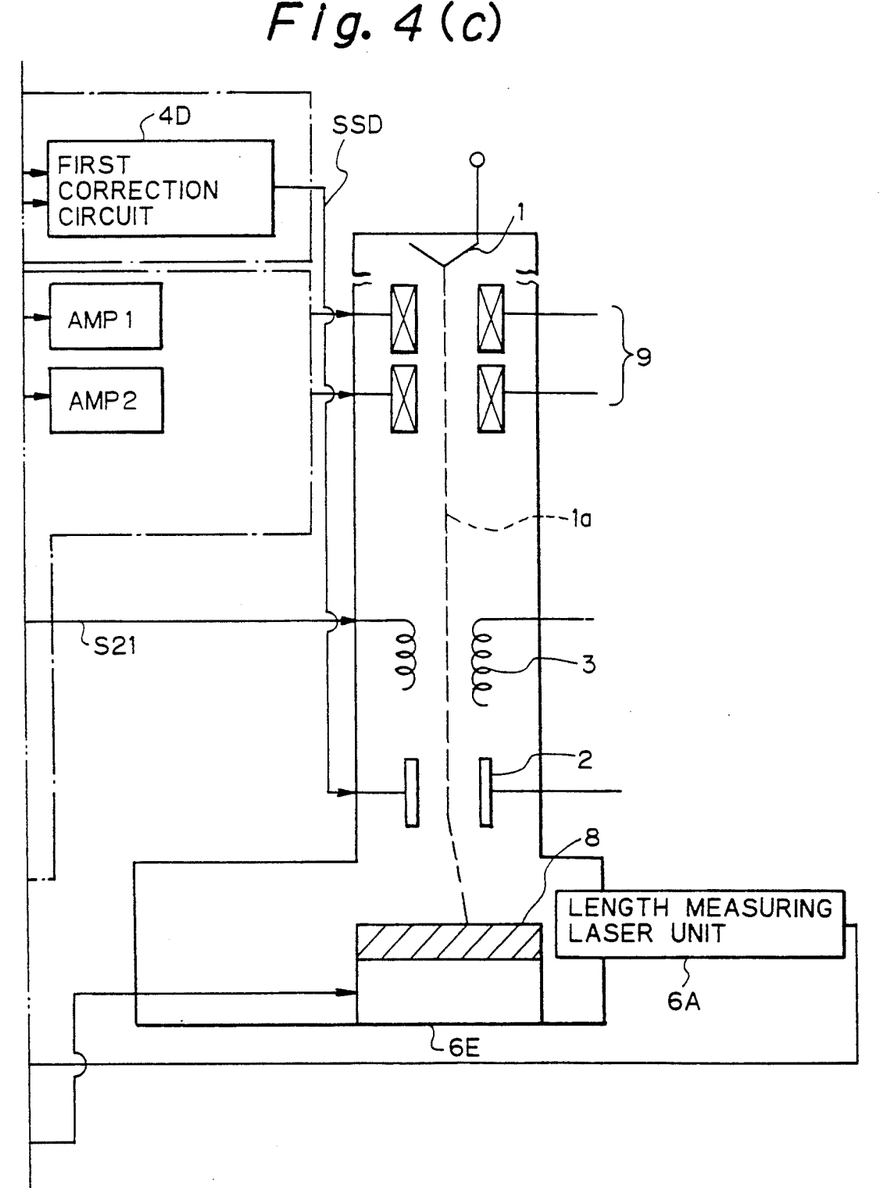

FIG. 4(a) to 4(c) are the block diagram showing an electron beam exposure system according to a prior art.

This system emits an electron beam 1a to draw an LSI pattern on an object 8 such as a semiconductor wafer. The system comprises an electron gun 1, an electrostatic deflector (a subdeflector) 2, an electromagnetic deflector (a main deflector) 3, a subdeflector driver 4, a main deflector driver 5, a length measuring laser unit 6A, a stage moving unit 6B, a stage controller 6C, a stage position correction unit 6D, a stage 6E, a central processing unit (CPU) 7, etc.

The main deflector driver 5 comprises a main deflector data buffer 5A, main deflector position setting circuit 5B, an addition/output circuit 5C, a second correction circuit 5D, a wait time generator 5E, a main deflector amplifier 5F, a field memory 5G, D/A converters DAC2 and DAC3, amplifiers AMP1 and AMP2, etc.

The exposure object 8 on the stage 6E is continuously moved by the stage moving unit 6B. The electron beam 1a from the electron gun 1 is deflected toward the exposure object 8 by the electrostatic deflector 2 and electromagnetic deflector 3.

To draw a pattern in a subregion of the exposure object 8, subdeflector data SD is supplied to a subdeflector data buffer 4A and a subdeflector pattern generation 4B of the subdeflector driver 4. The data SD is processed through a first correction circuit 4C, a D/A converter DAC1, the field memory 5G, and a subdeflector amplifier 4D, to provide a subdeflector signal SSD to the electrostatic deflector 2, which electrostatically deflects the electron beam 1a.

The timing of starting the pattern drawing in the subregion is controlled according to a drawing start signal S31 provided by the wait time generator 5E of the main deflector driver 5.

When the stage 6E is moved between main regions of the exposure object 8, main deflector data MD is supplied to the main deflector data buffer 5A of the main deflector driver 5. The main deflector position setting circuit 5B sets a deflective target position and provides main deflector data MD11 related to the deflective target position. The addition/output circuit 5C processes the main deflector data MD11 and stage position data STD provided by the stage controller 6C. The second correction circuit 5D corrects a stage moving quantity and a deflection quantity up to the deflective target position and provides corrected main deflector data MD12. The main deflector amplifier 5F processes the corrected main deflector data MD12 and provides a main deflector signal S21 to the electromagnetic deflector 3, which then electromagnetically deflects the electron beam 1a.

Meanwhile, the wait time generator 5E receives a main deflector set signal S11 (FIG. 7) contained in the corrected main deflector data MD12 provided by the second correction circuit 5D, and according to the signal S11, generates a pulse signal PS corresponding to the deflection quantity (jump quantity) of the electron beam 1a. The pulse signal PS defines a wait time T for stabilizing the main deflector amplifier 5F. The signal PS will be at a high (H) level for a waiting operation and a low (L) level for a non-waiting operation.

With this arrangement, the electron beam 1a is deflected toward the continuously moving object 8 to draw LSI patterns on the object.

Figure 5:
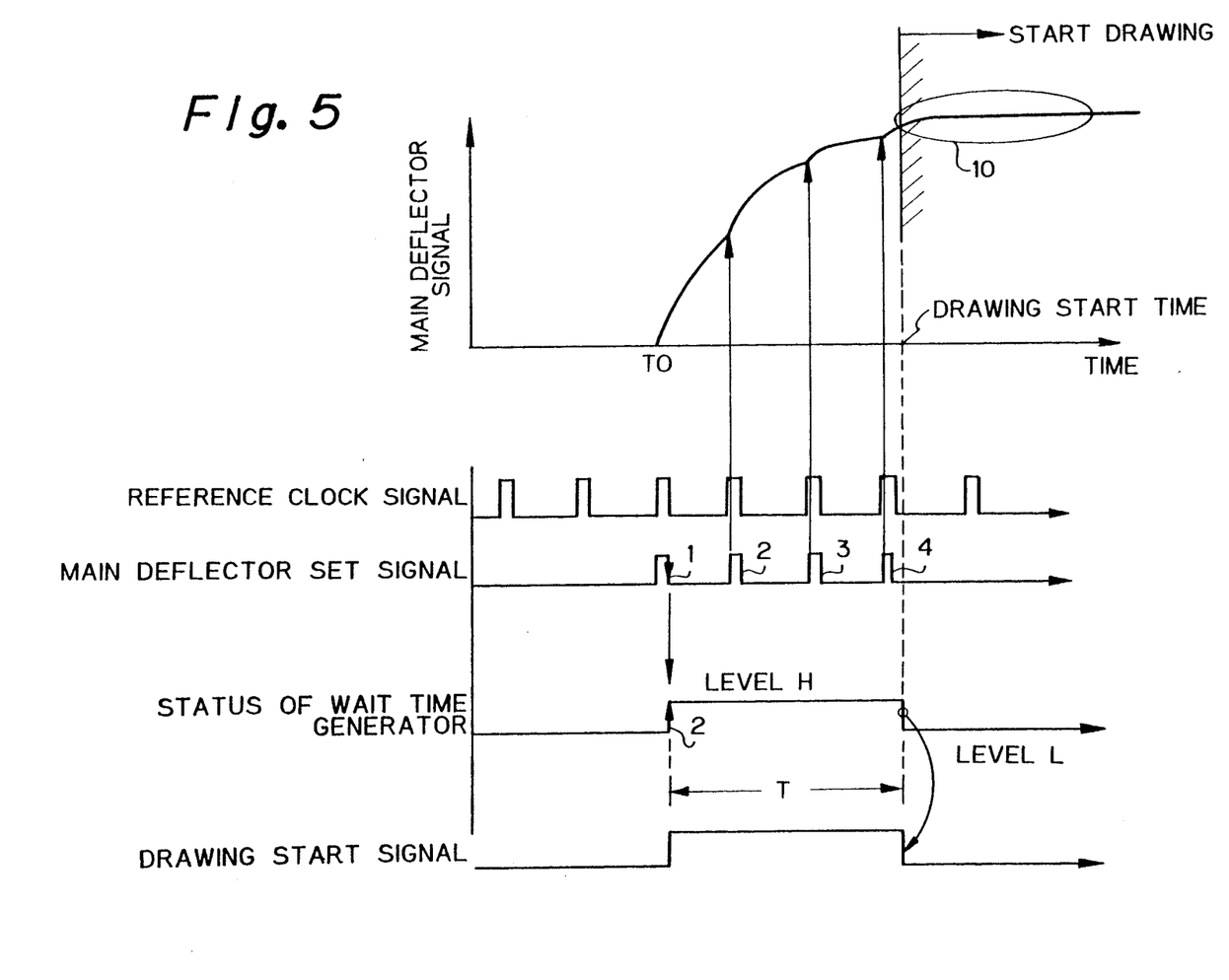
FIG. 5 is a signal waveform diagram explaining the problem of the prior art.

When the electron beam 1a is moved from an optional region to another region on the continuously moving object 8 to continue the pattern drawing, the timing Tx of starting the pattern drawing is synchronized with the low level of the drawing start signal S31, which falls to the low level after the wait time T as shown in FIG. 5.

Accordingly, depending on a period of reading the stage position and the wait time T, it may happen that a pulse (4) of the main deflector set signal S11 contained in the corrected main deflector data MD12 is provided to the main deflector amplifier 5F just before the elapse of the wait time T, and the drawing start signal S31 is provided to a subdeflector pattern generator 4B of the subdeflector driver 4 just after the wait time T. This is understood to happen due to a slight control difference between an electromagnetic deflector feedback control system and an electrostatic deflector feedback control system.

Here, the electromagnetic deflector feedback control system comprises the main deflector driver 5, length measuring laser unit 6A for measuring the position of the continuously moving stage 6E, and parts of the stage controller 6C involving a laser counter 61, an offset register 62, an adder 63, a stage position register 64, and a subtracter 66. The electrostatic deflector feedback control system comprises the length measuring laser unit 6A, laser counter 61, subtracter 67, third correction circuit 68, and D/A converter DAC4.

Due to the slight control difference between these two feedback control systems, the pattern drawing in a subregion of the object 8 may be started even if the main deflector amplifier 5F is not yet stabilized, i.e., even if the main deflector signal S21 from the main deflector amplifier 5F is in an unstable area 10 shown in FIG. 5. If this happens, a deformed pattern may be drawn on the exposure object 8, what deteriorates the reliability of the continuously moving stage exposure system.

SUMMARY OF THE INVENTION

An object of the invention is to provide a charged particle beam exposure system and a method of controlling the system, for controlling the timing of starting a pattern drawing process according to not only a wait time for stabilizing an electromagnetic deflector but also another wait time related to a period of reading a stage position, thereby to correctly draw patterns on an object and improve the reliability of a continuously moving stage exposure process.

Figure 1A:
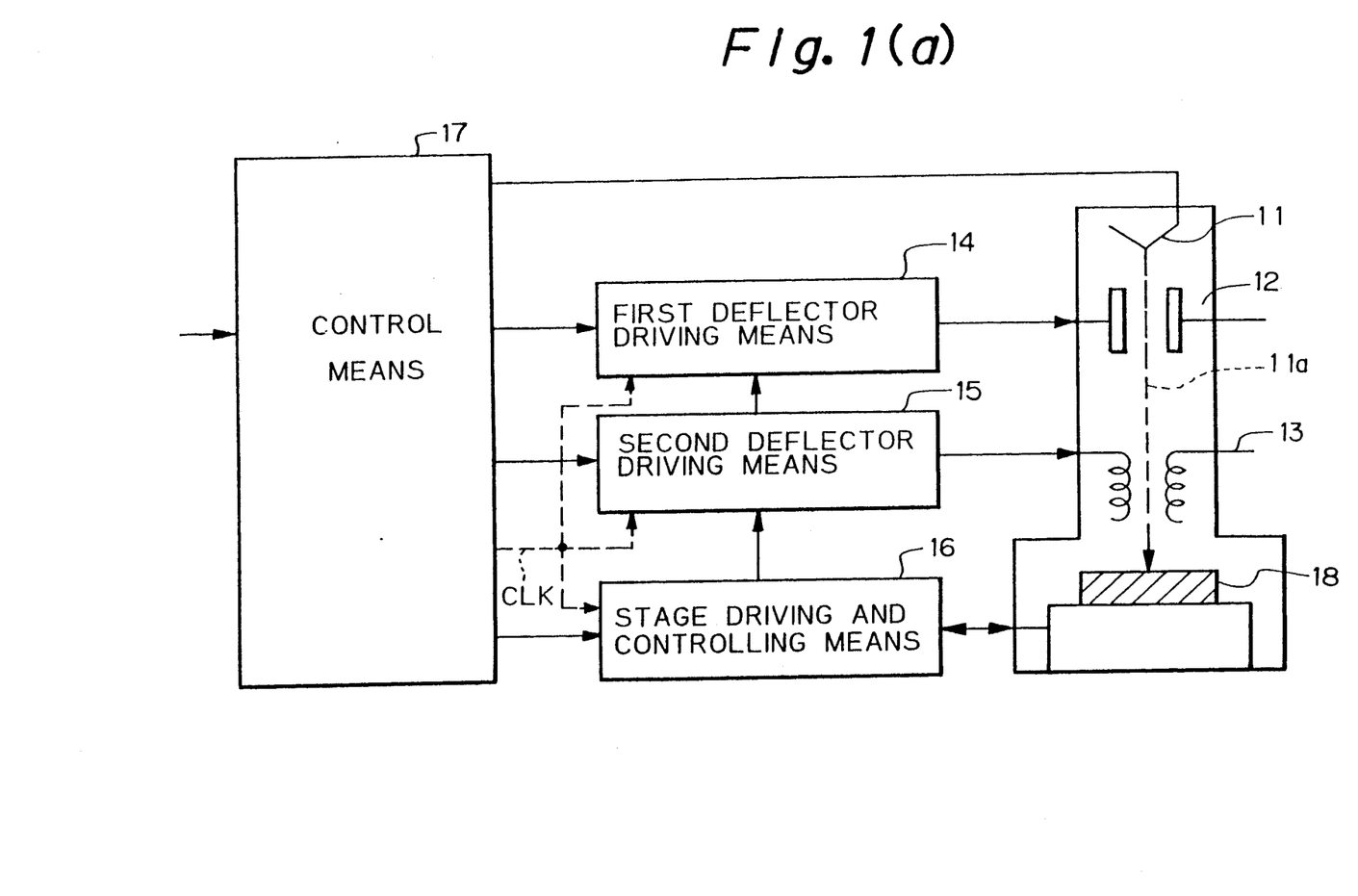
FIGS. 1(a) to 1(c) are views showing the arrangement and principle of operation of a charged particle beam exposure system according to the invention.
Figure 1B:
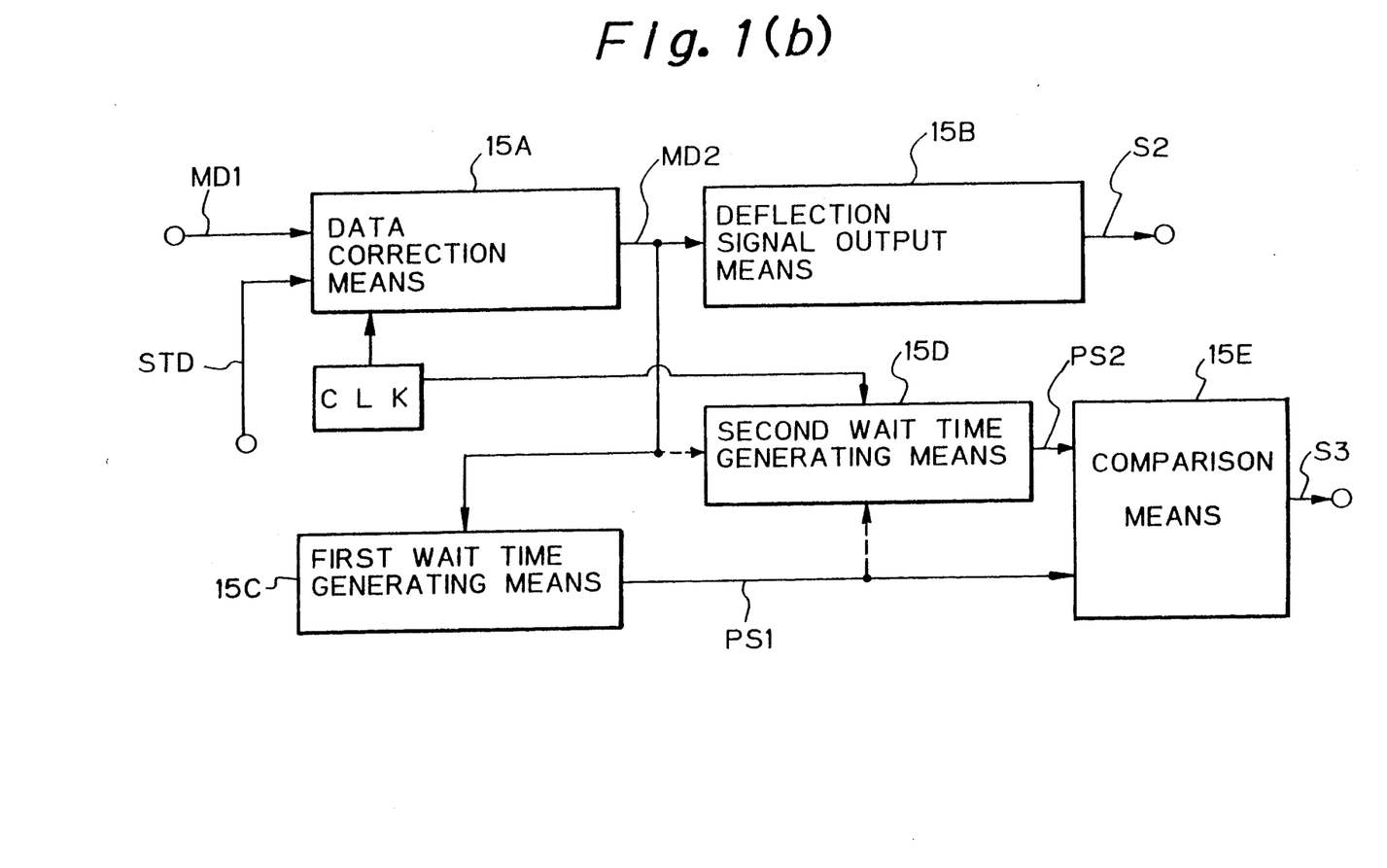
Figure 1C:
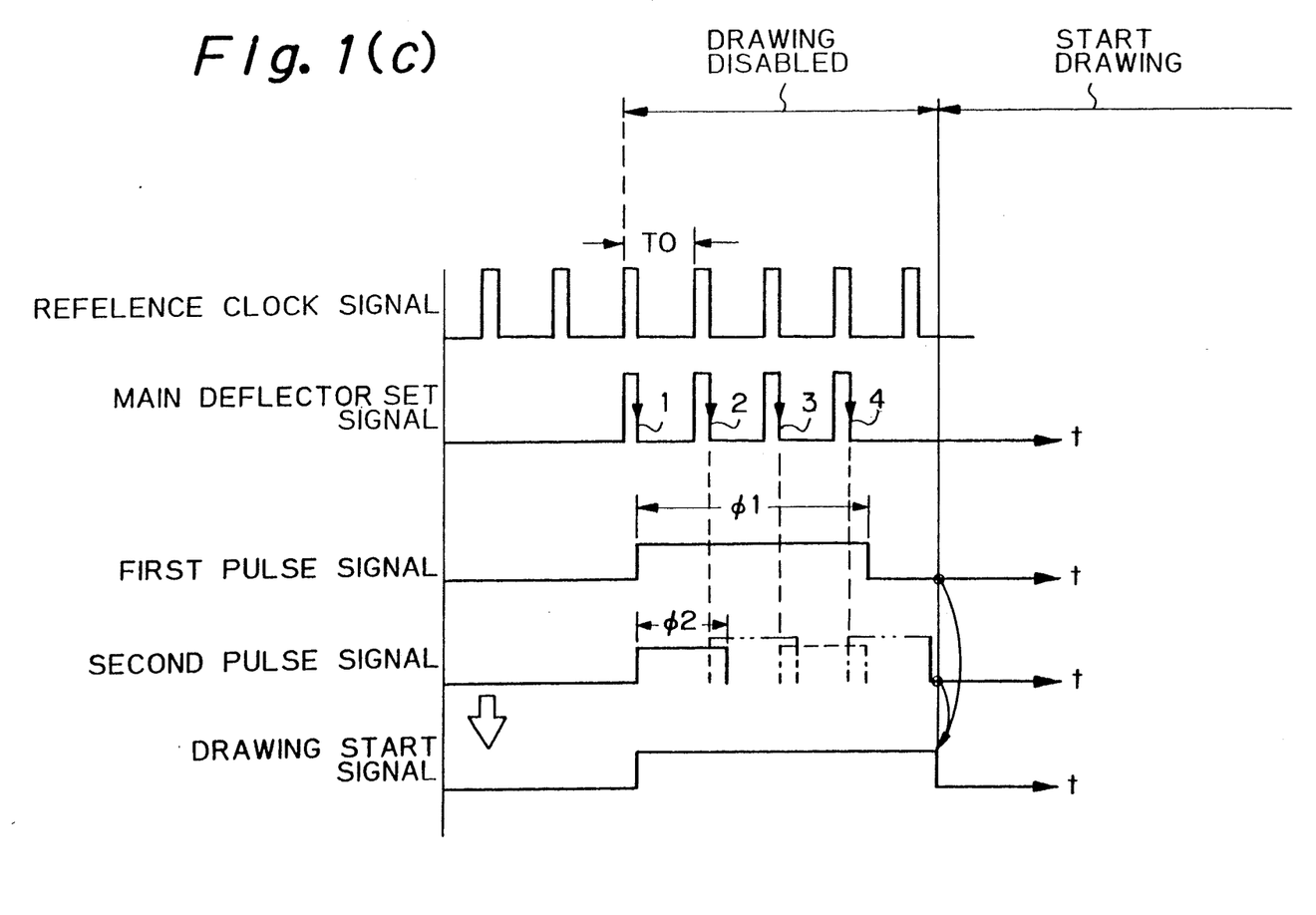

FIGS. 1(a) to 1(c) show the basic arrangement and the principle of operation of the charged particle beam exposure system of the invention.

As shown in FIG. 1(a), exposure system comprises a charged particle beam generating means 11 for emitting a charged particle beam 11a toward an object 18 to be exposed, first and second deflector means 12 and 13 for deflecting the charged particle beam 11a, a first deflector driving means 14 for controlling the output of the first deflector means 12, a second deflector driving means for controlling the output of the second deflector means 13, a stage driving and controlling means 16 for controlling the movement of the object 18, and a control means 17 for controlling the inputs and outputs of the charged particle beam generating means 11, first deflector driving means 14, second deflector driving means 15, and stage driving and controlling means 16.

As shown in FIG. 1(b), second deflector driving means 15 comprises at least a data correction means 15A for receiving main deflector data MD1 and stage position data STD and providing corrected main deflector data MD2, deflection signal output means 15B for providing a main deflector signal S2 according to the corrected main deflector data MD2, a first wait time generating means 15C for generating a first pulse signal PS1 according to the corrected main deflector data MD2, a second wait time generating means 15D for generating a second pulse signal PS2 in synchronism with the generation of the first pulse signal PS1, and a comparison means 15E for comparing the first and second pulse signals PS1 and PS2 with each other and providing a drawing start signal S3.

In accordance with the invention, the method of controlling this exposure system basically comprises the steps of receiving the main deflector data MD1 for electromagnetically deflecting the electron beam 11a and the stage position data STD obtained by reading a stage position; correcting the main deflector data MD1 according to the input data; providing the main deflector signal S2 according to the corrected main deflector data MD2; generating the first pulse signal PS1 according to the corrected main deflector data MD2; generating the second pulse signal PS2 in synchronism with the generation of the first pulse signal PS1; comparing the first and second pulse signals PS1 and, PS2 with each other; and according to a result of the comparison, providing the drawing start signal S3.

In this way, according to the system and method of the invention, the second deflector driving means 15 comprises the data correction means 15A, deflection signal output means 15B, first wait time generating means 15C, second wait time generating means 15D, and comparison means 15E.

The first pulse signal PS1 is generated according to a main deflector set signal S1 contained in the corrected main deflector data MD2, and the second pulse signal PS2 is generated in synchronism with the generation of the first pulse signal PS1. The drawing start signal S3 is provided according to the result of a comparison of the first and second pulse signals PS1 and PS2.

When the stage driving and controlling means 16 continuously moves the object 18 and when the charged particle beam generating means 11 emits the charged particle beam 11a toward the object 18, the first and second deflector means 12 and 13 deflect the beam 11a.

To shift the beam 11a from an optional region to another region on the object 18, the main deflector data MD1 and stage position data STD are provided to the data correction means 15A, which provides the corrected main deflector data MD2 to the deflection signal output means 15B and to the first and second wait time generating means 15C and 15D.

As shown in FIG. 1(c), according to the main deflector set signal S1 contained in the corrected main deflector data MD2, the first wait time generating means 15C generates the first pulse signal PS1 having a pulse width $\phi 1$ corresponding to a preset shift quantity of the electron beam 11a.

Similarly, with the main deflector set signal S1 as a start signal, the second wait time generating means 15D generates the second pulse signal PS2 having a pulse width $\phi 2$, which is shorter than the pulse width $\phi 1$ of the first pulse signal PS1.

The deflection signal output means 15B then provides the deflector signal S2 to the second deflector means 13. As mentioned above, the first pulse signal PS1 is generated according to the main deflector set signal S1, and the second pulse signal PS2 is generated with the main deflector set signal S1 serving as a trigger signal. Thereafter, the first and second pulse signals PS1 and PS2 are compared with each other in the comparison means 15E. For example, falls (end points) of the signals PS1 and PS2 are processed by a logical OR in the comparison means 15E, which then provides the drawing start signal S3 to the first deflector driving means 14.

Namely, while a main deflector amplifier 25G (FIG. 2) disposed in the second deflector driving means 15 FIG. 1(a) for deflecting the second deflector means 13, i.e., an electromagnetic deflector 23 (FIG. 2) is settling the second deflector means 13 itself may be activated, but the first deflector means 12, i.e., an electrostatic deflector is not activated through the first deflector driving means 14, and a blanking operation is carried out, i.e., turned on, such that the charged particle beam never reaches the exposure object 18 such as a wafer.

Even if a slight control difference occurs between the electromagnetic deflector feedback control system and the electrostatic deflector feed back control system, or if an error occurs in the timing of reading the stage position data STD of the continuously moving stage, the drawing start signal S3 will never be provided to the first deflector driving means 14 just before the elapse of the wait time.

Namely, the pattern drawing will never be started unless the deflection signal output means 15B is stabilized. As a result, patterns are correctly drawn on the exposure object 18, and the reliability of the continuously moving stage exposure system is improved.

DESCRIPTION OF THE PREFERRED EMBODIMENTS

An embodiment of the invention will be explained in detail with reference to the drawings.

Figure 2A:
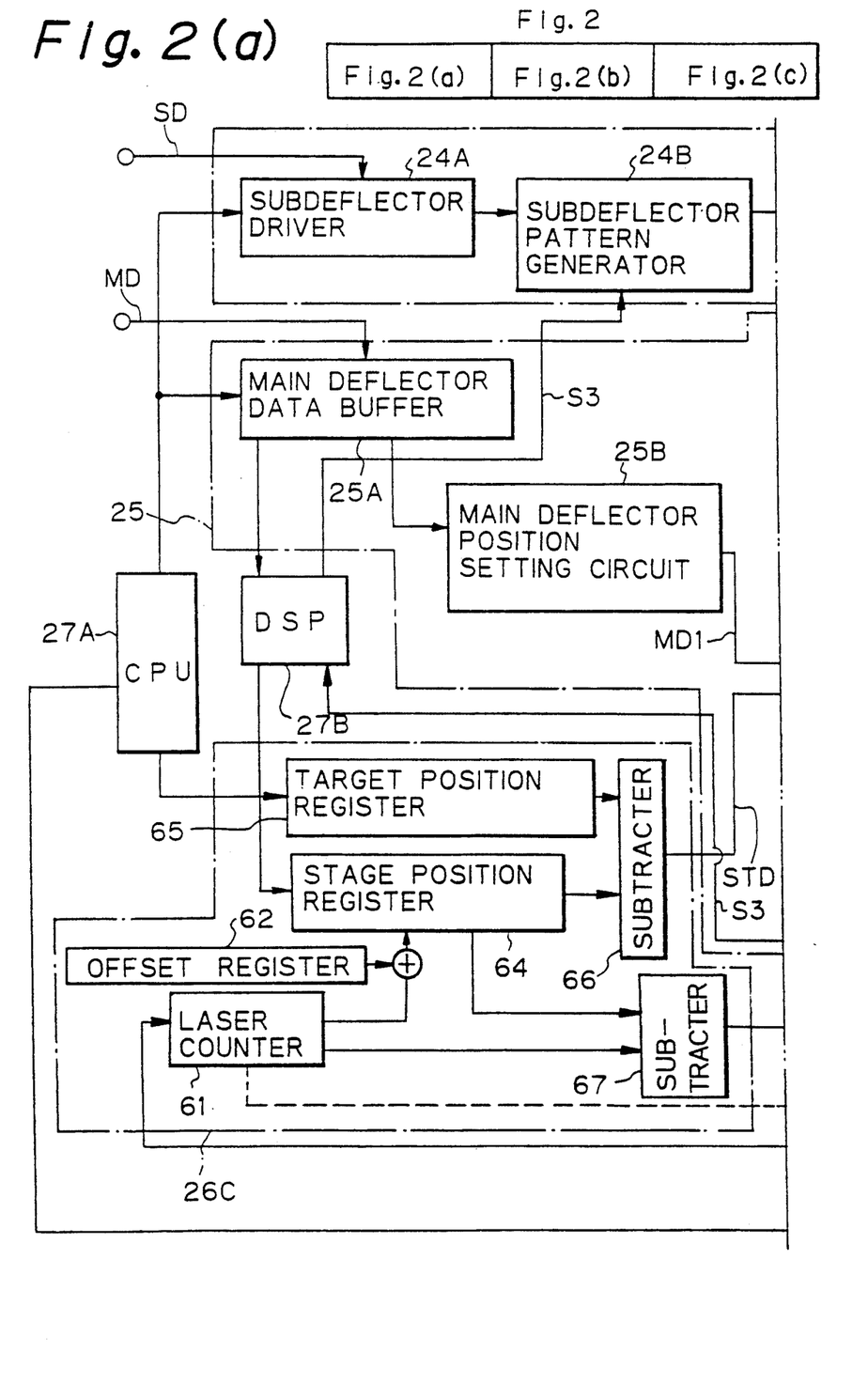
FIG. 2(a) to 2(c) are in the composite a block diagram timing an electron beam exposure system according to an embodiment of the invention.
Figure 2B:
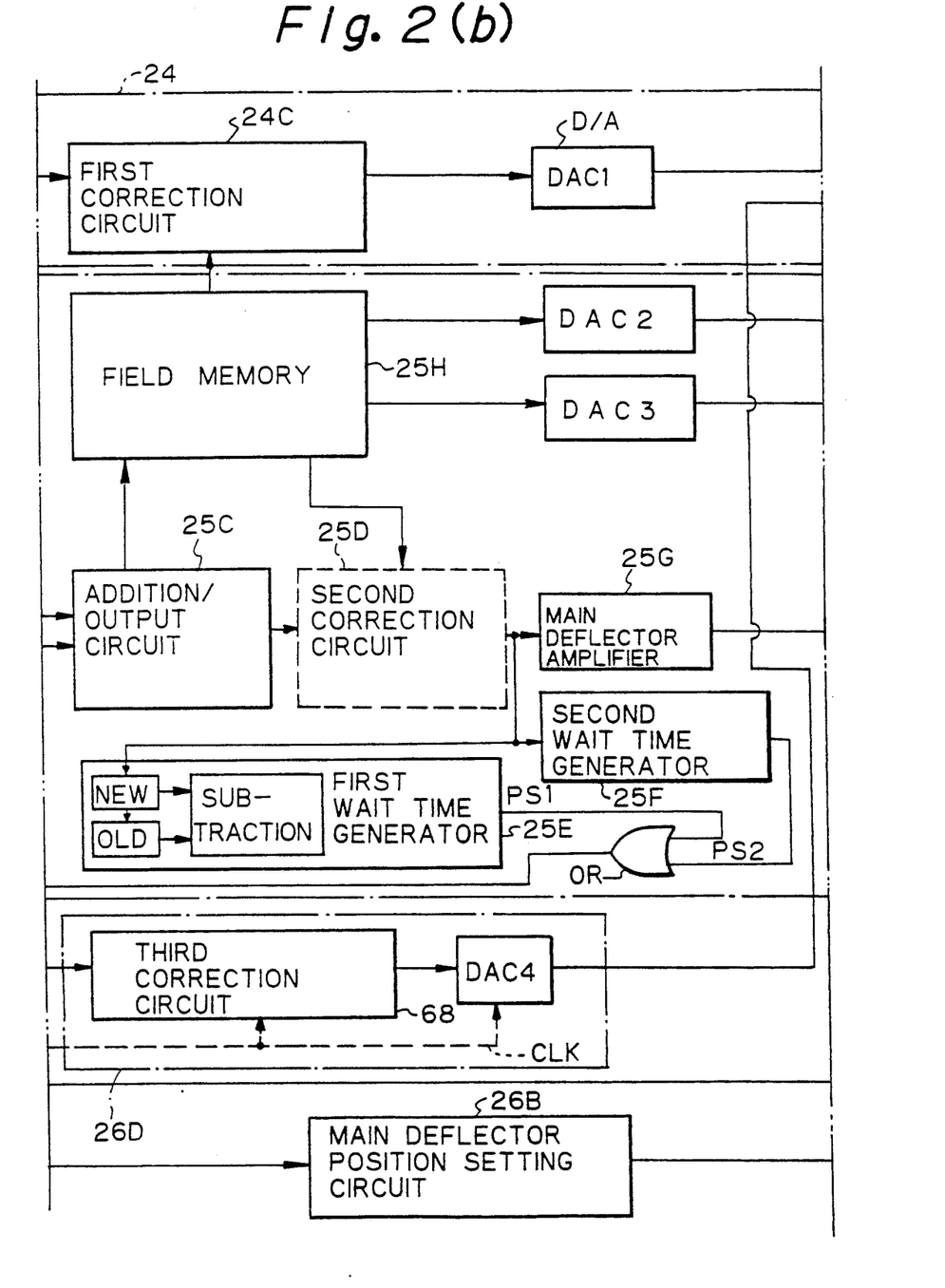
Figure 2C:
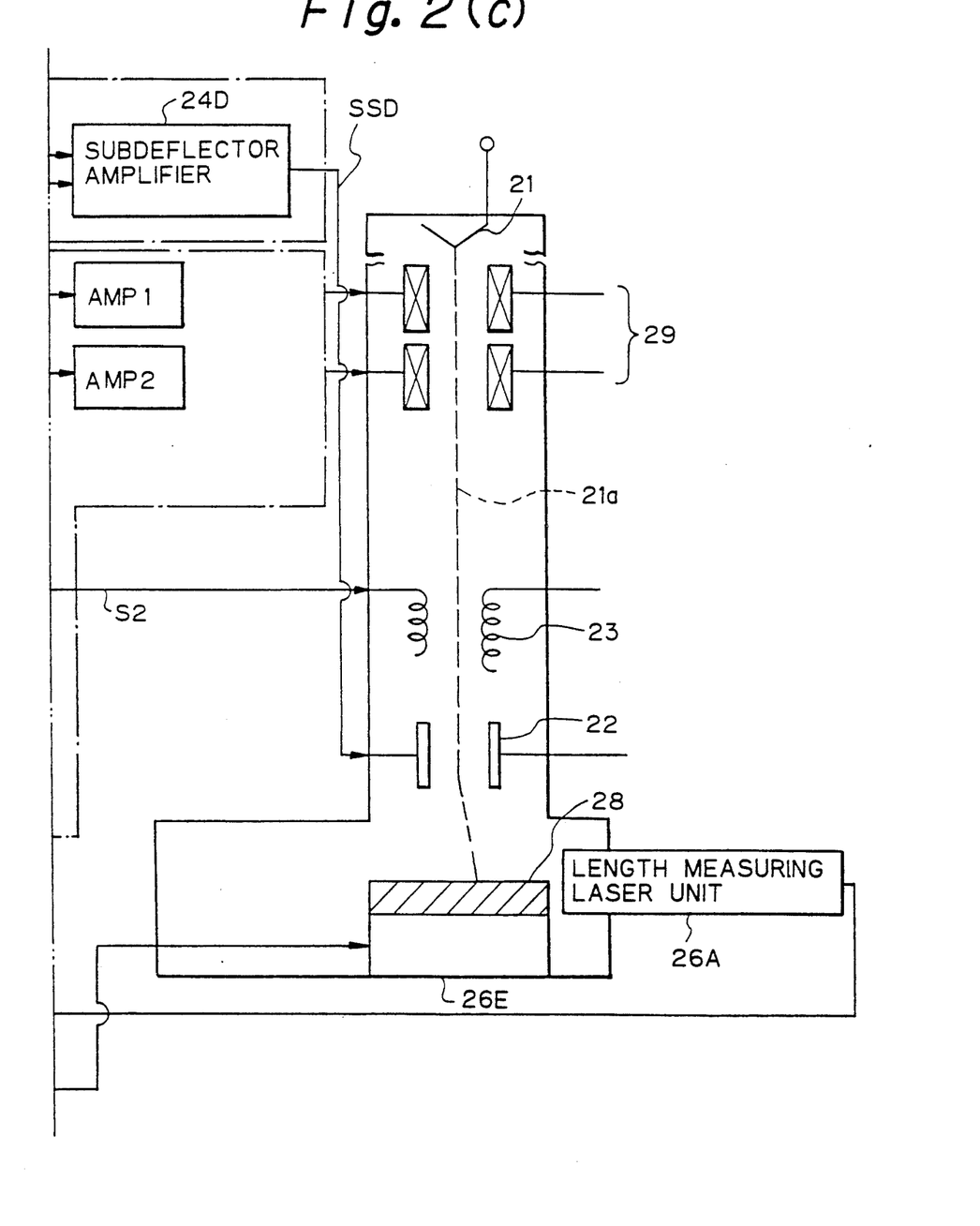
Figure 3:
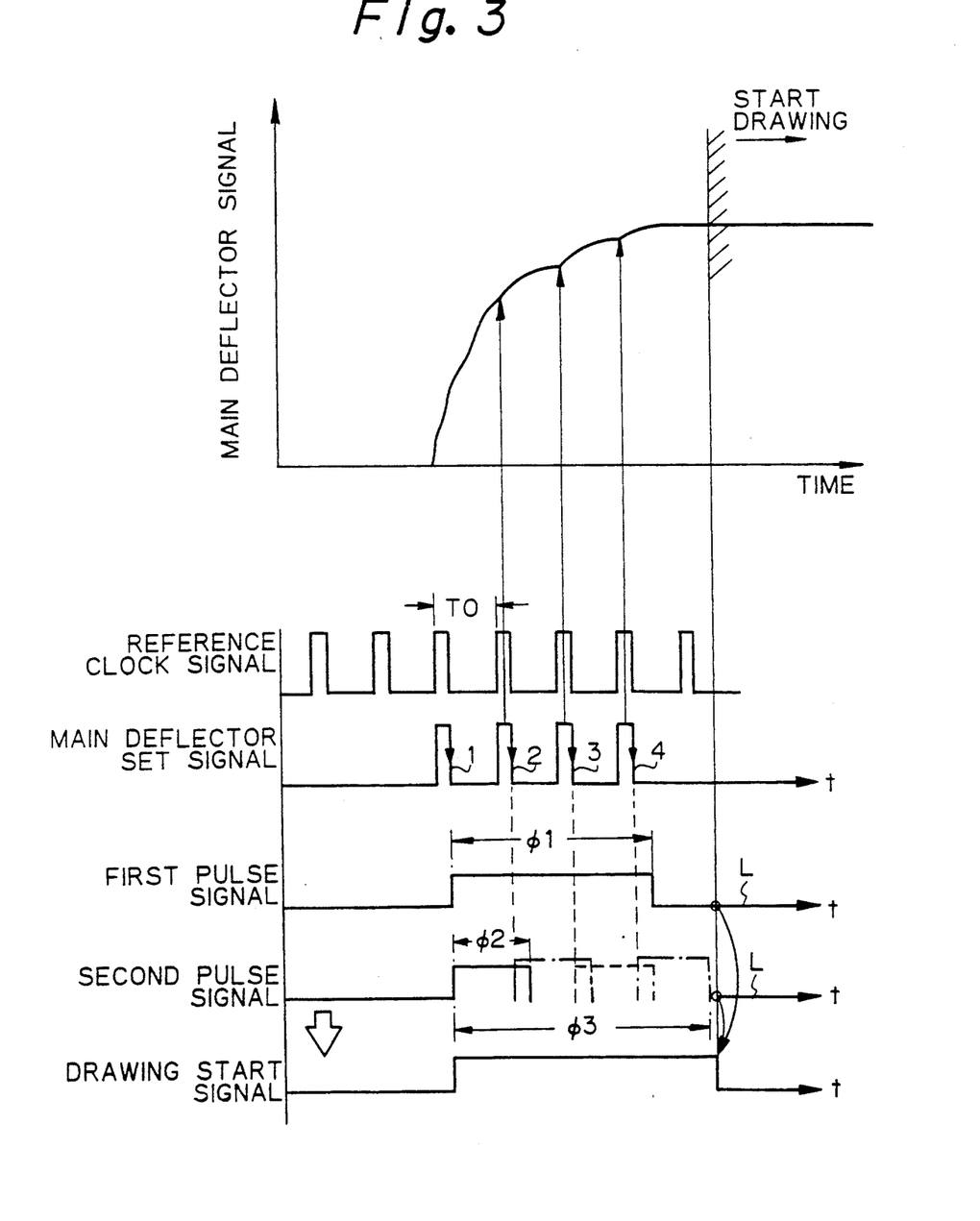
FIG. 3 is a time chart explaining a pattern drawing starting operation according to an embodiment of the invention.

FIGS. 2(a) to 2(c) in the composite show an electron beam exposure system according to the embodiment of the invention, and FIG. 3 explains a method of controlling the system according to the invention.

This electron beam exposure system employs an electron beam 21a as an example of the charged particle beam 11a of FIG. 1(a). The system comprises an electron gun 21, an electrostatic deflector (a subdeflector) 22, an electromagnetic deflector (main deflector) 23, a subdeflector driver 24, a main deflector driver 25, a length measuring laser unit 26A, a stage moving unit 26B, a stage controller 26C, a stage position correction unit 26D, a stage 26E, etc.

The electron gun 21 is an example of the charged particle beam generating means 11 and emits the electron beam 21a toward an object 28 to be exposed.

The electrostatic deflector (subdeflector) 22 is an example of the first deflector means 12 and electrostatically deflects the electron beam 21a.

The electromagnetic deflector (main deflector) 23 is an example of the second deflector means 13 and electromagnetically deflects the electron beam 21a.

The subdeflector driver 24 is an example of the first deflector driving means 14 and comprises a subdeflector data buffer 24A, a subdeflector pattern generator 24B, a first correction circuit 24C, a D/A converter DAC1, and a subdeflector amplifier 24D.

Subdeflector data SD is supplied to the subdeflector data buffer 24A and processed through the subdeflector pattern generator 24B, first correction circuit 24C, D/A converter DAC1, a field memory 25H, and the subdeflector amplifier 24D, to provide a subdeflector signal SSD to the electrostatic deflector 22 for electrostatically deflecting the electron beam 21a.

A pattern drawing process in a subdeflector exposure region of the object 28 is started according to a drawing start signal S3 that is generated and processed through first and second wait time generators 25E and 25F disposed in the main deflector driver 25 and through a digital signal processor (DSP) 27B.

The main deflector driver 25 is an example of the second deflector driving means 15 and comprises a main deflector data buffer 25A, a main deflector position setting circuit 25B, an addition/output circuit 25C and a second correction circuit 25D as an example of the data correction means 15A, the main deflector amplifier 25G as an example of the deflection signal output means 15B, the first wait time generator 25E as an example of the first wait time generating means 15C, the second wait time generator 25F as an example of the second wait time generating means 15D, an OR circuit OR and the field memory 25H as an example of the comparison means 15E, and deflector amplifiers AMP1 and AMP2.

The second correction circuit 25D has a function of adjusting fine distortions and is used when required. This circuit 25D may be omitted. If it is omitted, an output of the addition/output circuit 25C is used as main deflector data MD2.

When main deflector data MD is supplied to the main deflector data buffer 25A of the main deflector driver 25, the main deflector position setting circuit 25B sets a deflective target position and provides main deflector data MD1 related to the deflective target position. The addition/output circuit 25C processes the data MD1 and stage position data STD provided by the stage controller 26C and provides main deflector data MD2.

When required, the second correction circuit 25D corrects the main deflector data MD2 for a stage moving quantity and a deflection quantity to the deflective target position.

The main deflector data MD2 is then processed by the main deflector amplifier 25G, which provides a main deflector signal S2 to the electromagnetic deflector 23 for electromagnetically deflecting the electron beam 21a between exposure regions of the continuously moving object 28.

At this time, the first wait time generator 25E generates a first pulse signal PS1 corresponding to a deflection quantity (jump quantity) of the electron beam 21a according to a main deflector set signal S1 contained in the main deflector data MD2 provided by the addition/output circuit 25C, or in the corrected main deflector data MD2 provided by the second correction circuit 25D.

The pulse signal PS1 has a pulse width of $\phi 1$ for defining a wait time T for stabilizing the main deflector amplifier 25G shown in FIG. 5. During this wait time T, the electron beam 21a is preferably put in a blanking state in which the blanking operation is ON. The pulse signal PS1 will be at a high (H) level for a waiting operation and at a low (L) level for a non-waiting operation.

The pulse width $\phi 1$ of the first pulse signal PS1 is preferably proportional to the difference between the present position of the electron beam 21a and the deflective target position. Also, the pulse width φ1 of the first pulse signal PS1 preferably involves a plurality of pulses of the main deflector set signals S1.

The pulse width φ1 of the first pulse signal PS1 is properly determined according to the difference between a previously measured deflection quantity and a currently measured deflection quantity, the moving speed of the stage 26E, etc.

The difference between the present position of the electron beam 21a and the deflective target position in the next target region on the object 28 is calculated according to the main deflector data MD1 provided by the main deflector position setting circuit 25B and the stage position data STD related to the present electron beam position provided by the stage controller 26C.

When patterns are completely drawn in the present pattern drawing region on the object 28, the addition/output circuit 25C provides the main deflector set signal S1 contained in the main deflector data MD2. Then, the electron beam is deflected and shifted toward the deflective target position in the next pattern drawing region of the object 28 while deducting the deflection quantity up to the target position. At the same time, the first wait time generator 25E generates the first pulse signal PS1 in response to a first pulse (1) of the main deflector set signal S1.

The main deflector set signal S1 is provided by the addition/output circuit 25C when a signal indicating the completion of pattern drawing by the electron beam 21a in the present pattern drawing region is timed to a reference clock signal CLK. Thereafter, while the data MD2 is being provided, a plurality of pulses (1), (2), (3), (4), and so on of the main deflector set signals S1 are provided in response to pulses of the reference clock signal CLK.

Meanwhile, the second wait time generator 25F generates a second pulse signal PS2. Basically, the second pulse signal PS2 is generated in synchronism with the generation of the first pulse signal PS1.

For example, as shown in FIG. 2(a) to 2(c), the second pulse signal PS2 is generated by the second wait time generator 25F according to the main deflector set signal S1 contained in the corrected main deflector data MD2 provided by the second correction circuit 25D.

Alternatively, a first pulse of the second pulse signal PS2 may be provided in response to the generation of the first pulse signal PS1 provided by the first wait time generator 25E, and the following pulses of the second pulse signal PS2 may be generated in response to pulses of the reference clock signal CLK.

It is also possible that a first pulse of the second pulse signal PS2 is provided in synchronism with the first pulse (1) of the main deflector set signal S1 contained in the main deflector data MD2, and the following pulses of the second pulse signal PS2 are provided in response to pulses of the reference clock signal CLK.

Further, an internal oscillation circuit may be employed to generate, with the first pulse signal PS1 being a trigger, the second pulse signal PS2 having a predetermined period and a predetermined pulse width.

It is preferable that the pulse width φ2 of the second pulse signal PS2 is shorter than the pulse width φ1 of the first pulse signal PS1.

It is also preferable that the pulse width φ2 of the second pulse signal PS2 is sufficiently long to cover the difference between a rise or a fall (i.e., the low level) of the last pulse (4) of the main deflector set signal S1 contained in the pulse width φ1 of the first pulse signal PS1 and a temporal point at which the electromagnetic deflector 23 is completely stabilized.

The number of pulses of the main deflector set signal S1 contained in the pulse width φ1 of the first pulse signal PS1 is not particularly limited but may be properly determined according to the stage moving speed, the deflection quantity of the main deflector, etc. In the embodiment of FIG. 3, four pulses (1) to (4) of the main deflector set signal S1 are contained in the pulse width φ1 of the first pulse signal PS1.

The first and second pulse signals PS1 and PS2 are compared with each other in the OR circuit OR, which provides the drawing start signal S3 to the DSP 27B. As a result, the electron beam which is in the blanking state is oriented to the surface of the object 28 through the electrostatic deflector 22 to draw patterns on the surface of the object 28.

If the pulse (4) of the main deflector set signal S1 is produced just before the first pulse signal PS1 is turned OFF, the prior art explained before provides the drawing start signal S31 even if an output of the main deflector amplifier 25G for controlling the main deflector, i.e., the electromagnetic deflector 23 is not stabilized yet.

Unlike this operation of the prior art, the present invention suppresses any output of the drawing start signal S3 so as to continuously maintain a drawing stopping state after the last pulse (4) of the main deflector set signal S1 is provided, for a period necessary for stabilizing the output of the main deflector amplifier 25G.

The length measuring laser unit 26A forms a part of the stage driving and controlling means 16 and measures the position of the stage 26E moved by the stage moving unit 26B.

The stage controller 26C comprises a laser counter 61, an offset register 62, an adder 63, a stage position register 64, a target position register 65, and subtracters 66 and 67. In the stage controller 26C, the laser counter 61 counts the number of displacement pulses measured by the length measuring laser unit 26A, the offset register 62 and adder 63 process the counted data, and the stage position register 64 stores the processed stage position data. The target position register 65 stores stage position target data provided by the DSP 27B, and the subtracter 66 processes a movement control quantity and provides stage position data STD to the addition/output circuit 25C of the main deflector driver 25. The subtracter 67 provides subtracted stage position data STD to the stage position correction unit 26D.

The stage position correction unit 26D comprises a third correction circuit 68 and a D/A converter DAC4. The stage position correction unit 26D corrects the stage position data STD provided by the subtracter 67, converts the corrected data into analog data, and provides the analog data to the subdeflector amplifier 24D.

A central processing unit (CPU) 27A forms a part of the control means 17 shown in FIG. 1(a) and controls the input and output of the electron gun 21, subdeflector data buffer 24A of the subdeflector driver 24, main deflector data buffer 25A of the main deflector driver 25, stage moving unit 26B, etc.

The digital signal processor (DSP) 27B forms the remaining part of the control means 17 shown in FIG. 1(a) and improves the speeds of the processes of reading a stage position and transferring data such as the drawing start signal.

Numeral 29 denotes other deflectors such as a focus adjusting coil and a distortion correction coil. These coils are driven by the deflector amplifiers AMP1 and AMP2 included in the main deflector driver 25.

With these components, the electron beam exposure system of the embodiment of the invention is formed.

FIG. 3 is a time chart explaining a drawing start operation of the embodiment of the invention.

The electron beam 21a is deflected by the electrostatic deflector 22 and electromagnetic deflector 23. When the electron beam 21a is shifted from an optional region to another region on the exposure object 28, the main deflector data MD and stage position data STD are first provided.

The main deflector data MD is read out of the main deflector data buffer 25A, and the main deflector position setting circuit 25B sets a deflective target position to which the electron beam 21a is shifted. Main deflector data MD1 related to the deflective target position is provided to the addition/output circuit 25C. Also, a position of the continuously moving stage on which the exposure object 28 is placed is measured by the length measuring laser unit 26A, and stage position data STD is provided to the addition/output circuit 25C through the stage controller 26C. As mentioned before, the addition/output circuit 25C adds the main deflector data MD1 and stage position data STD to each other and calculates the difference between the deflective target position and the present stage position.

According to the difference, the main deflector set signal S1 is provided in synchronism with a signal indicating that patterns have been completely drawn in the present region on the object 28, and according to pulses (1) to (4) of the main deflector set signal S1, the electron beam 21a is gradually deflected to the deflective target position in the next pattern drawing region, while deducting the difference.

The main deflector data MD2 containing the main deflector set signal S1 provided by the addition/output circuit 25C is provided to the main deflector amplifier 25G, which provides the main deflector signal S2 for driving the electromagnetic deflector 23.

The main deflector data MD2 provided by the addition/output circuit 25C is also provided to the first wait time generator 25E, which generates the first pulse signal PS1 as mentioned before.

The second wait time generator 25F having any one of the arrangements mentioned above basically operates in synchronism with the first pulse signal PS1. In FIG. 3, the main deflector set signal S1 contained in the main deflector data MD2 and provided to the second wait time generator 25F from the addition/output circuit 25C acts as a trigger for generating the second pulse signal PS2.

It is possible to arrange, if required, the second correction circuit 25D between the addition/output circuit 25C and the main deflector amplifier 25G, for adjusting fine displacements involved in the output of the addition/output circuit 25C. If the second correction circuit 25D is so arranged, the second correction circuit 25D corrects the main deflector data MD2 and provides the corrected main deflector data MD2' to the main deflector amplifier 25G and to the first and second wait time generators 25E and 25F.

The main deflector data MD2 indicates the coordinates of a drawing start position calculated from the difference between the deflective target position and the present stage position and an original point of a region on the object 28 where patterns are to be drawn. The main deflector data MD2 includes the main deflector set signal S1, which is a supplemental clock signal of the drawing start signal S3 for starting the pattern drawing at the drawing start position.

The main deflector amplifier 25G provides the main deflector signal S2 according to the corrected main deflector data MD2. Namely, the main deflector amplifier 25G provides a deflector driving analog voltage to the electromagnetic deflector 23.

At the same time, the first and second wait time generators 25E and 25F generate the first and second pulse signals PS1 and PS2, respectively, according to the main deflector set signal S1 contained in the corrected main deflector data MD2.

The first wait time generator 25E generates the first pulse signal PS1 in synchronism with a fall (1) i.e., the trailing/falling edge of the main deflector set signal S1. The first pulse signal PS1 has a pulse width of $\phi 1$ corresponding to a predetermined shift quantity of the electron beam 21a.

The second pulse generator 25F generates the second pulse signal PS2 in synchronism with the fall (i.e. the low level) (1) of the main deflector set signal S1. The pulse width $\phi 2$ of the second pulse signal PS2 is shorter than the pulse width $\phi 1$ of the first pulse signal PS1.

In synchronism with four pulses, i e., four falls (1) to (4) of the main deflector set signal S1 (i.e., transistors to the low level), four pulses of the second pulse signal PS2 are generated. An apparent pulse width $\phi 3$ between a rise (1) (i.e., from the low to the high level) and a fall (4) (i.e., from the high to the low level) of the second pulse signal PS2 is set to be longer than the pulse width $\phi 1$ of the first pulse signal PS1.

Since a drawing start signal is provided after detecting falls, i.e., low levels (end points) of the first and second pulse signals PS1 and PS2, the pattern drawing will never be carried out during an unstable state of the main deflector amplifier 25G. For example, according to a logical OR of the signal levels of the first and second pulse signals PS1 and PS2, the comparison means 15E provides the drawing start signal S3 to the subdeflector driver 24, which may carry out the pattern drawing according to the signal S3.

In this way, the exposure system and the method of controlling the system according the embodiment of the invention shown in FIGS. 2 and 3 employs the main deflector driver 25 comprising the main deflector data buffer 25A, main deflector position setting circuit 25B, addition/output circuit 25C, second correction circuit 25D, which is arranged as shown and if required, first wait time generator 25E, second wait time generator 25F, OR circuit OR, and main deflector amplifier 25G. According to the main deflector set signal S1 contained in the processed main deflector data MD2, the first and second pulse signals PS1 and PS2 are generated, compared, and processed to provide the drawing start signal S3.

To shift the electron beam 21a from an optional region to another region on the continuously moving object 28 to write patterns thereon, the main deflector amplifier 25G provides the main deflector signal S2 to the electromagnetic deflector 23, while the first and second pulse signals PS1 and PS2 generated according to the main deflector set signal S1 contained in the main deflector data MD2 are compared with each other. As a result of the comparison, the OR circuit OR provides the drawing start signal S3 according to, for example, falls (end points) of the first and second pulse signals PS1 and PS2, to the subdeflector pattern generator 24B of the subdeflector driver 24.

Even if a fine control difference occurs between the electromagnetic deflector feedback control system and the electrostatic deflector feedback control system, or even if an error occurs in the timing of reading the stage position data STD of the continuously moving stage, the embodiment will never provide the main deflector data MD2 to the main deflector amplifier 25G just before the elapse of the wait time T.

As a result, the pattern drawing process will never be started until the electron beam 21a is stabilized. The embodiment correctly draws patterns on the exposure object 28, thereby improving the reliability of the stage continuous moving exposure system.

As explained above, the charged particle beam exposure system and the method of controlling the system according to the invention employs a second deflector driving means comprising a data processing means, a deflection signal output means, first and second wait time generating means, and a comparison means. According to processed and corrected main deflector data, first and second pulse signals are generated, processed, and compared to provide a drawing start signal.

To shift an electron beam from an optional region to another region on a continuously moving object to draw patterns on the object, the deflection signal output means provides a deflector signal to a second deflector means. At the same time, the first and second pulse signals are generated according to a main deflector set signal and compared with each other, to provide the drawing start signal for starting an electrostatic deflection process.

This arrangement correctly draws patterns on the exposure object and improves the reliability of the stage continuous moving exposure system.

We claim:

1. A charged particle beam exposure device having a charged particle beam generating means for emitting a charged particle beam toward an exposure object positioned on a stage, a deflector means for deflecting the charged particle beam, a deflector driving means for controlling the output of the deflector means, a stage driving and controlling means for controlling the movement of the stage and thereby of the exposure object, and a control means for controlling the inputs to and the outputs of the charged particle beam generating means, the deflector driving means and the stage driving and controlling means, said deflector driving means comprising:

data correction means for receiving main deflector data from a storage means and stage position data from the stage driving and controlling means, and providing corrected main deflector data which includes a main deflector set signal;

deflection signal output means for providing a main deflector signal according to the corrected main deflector data;

first wait time generating means for generating a first pulse signal in response to the timing of the output of the corrected main deflector data from said data correction means;

second wait time generating means for generating a second pulse signal according to a signal selected from the first pulse signal, a clock pulse signal and the corrected main deflector data which includes the main deflector set signal, the pulse width of the second pulse signal being different from that of the first pulse signal; and comparison means for comparing the first and second pulse signals with each other and providing a drawing start signal according to the result of the comparison.

2. A system according to claim 1, wherein the first and second pulse signals are generated in response to the timing of the output of the main deflector set signal contained in the corrected main deflector data from said data correction means.

3. A device according to claim 1, wherein the second wait time generating means generates the second pulse signal in response to the clock pulse signal and further in response to the first pulse signal acting as a trigger.

4. A device according to claim 1, wherein the second wait time generating means further comprises an internal oscillation circuit for generating pulses each having a predetermined period and a predetermined width and generates the second pulse signal in response to the first pulse signal, acting as a trigger, and comprising a succession of said pulses generated by said internal oscillation circuit.

5. A device according to claim 1, wherein the pulse width of the second pulse signal is shorter than the pulse width of the first pulse signal.

6. A device according to claim 5, wherein the pulse width of the first pulse signal is proportional to the difference between the present position of the charged particle beam and a pattern drawing target position.

7. A device according to claim 6, wherein the pulse width of the first pulse signal is set at a value which encompasses a plurality of pulses of said second pulse signal.

8. A device according to claim 6, wherein the pulse width of the second pulse signal is set to be sufficiently long so as to encompass the time difference between the time at which a last one of a plurality of pulses of the main deflector set signal encompassed within the pulse width of the first pulse signal is raised or has fallen and the time at which said deflector means is completely stabilized.

9. A method of controlling a charged particle beam exposure system having a charged particle beam generating means for emitting a charged particle beam toward an exposure object positioned on a stage, a deflector means for deflecting the charged particle beam, a deflector driving means for controlling the output of the deflector means, a stage driving and controlling means for controlling the movement of the stage and thereby of the exposure object, and a control means for controlling the inputs to and the outputs of the charged particle beam generating means, the deflector driving means and the stage driving and controlling means, comprising the steps of:

providing main deflector data for electromagnetically deflecting the said charged particle beam to a target position on the stage;

measuring the stage position and providing corresponding stage position data;

processing and correcting the received main deflector data utilizing the stage position data and producing corrected main deflector data which includes a main deflector set signal;

producing a main deflector signal for controlling a deflection quantity of the charged particle beam as produced by the beam deflector means in accordance with the corrected main deflector data;

generating a first pulse signal having a predetermined pulse length, in response to the timing of the output of the corrected main deflector data;

generating a second pulse signal, having a pulse length shorter than that of the first pulse signal, in accordance with a signal selected from the first pulse signal, a clock pulse signal and the corrected main deflector data which includes the main deflector set signal;

calculating the difference between the target position and the moved distance of the stage, represented by vector value from the deflection starting time, at a predetermined interval, and correcting the main deflector signal in accordance with the result of the calculation;

determining a time when the first and second pulse signals have both stopped; and providing a drawing start signal according to the time determination.

* * * * *

UNITED STATES PATENT AND TRADEMARK OFFICE
CERTIFICATE OF CORRECTION

PATENT NO.   : 5,225,684
DATED        : July 6, 1993
INVENTOR(S)  : TAKI et al.

It is certified that error appears in the above-indentified patent and that said Letters Patent is hereby corrected as shown below:

Col. 1,  line 30, delete "the method activates";
         line 58, change "are the" to --, in the composite, is a--;
         line 59, change "a" to --the--.

Col. 3,  line 23, change "what" to --which--;
         line 39, after "1(a)," insert --the--.

Col. 5,  line 25, after "are" insert --,-- and after "composite" insert --,--.
         line 26, change "timing" to --of--;
         line 28, change "time" to --timing--;
         line 32, after "are" insert --,-- and after "composite" insert --,--
         line 42, after "2(c)" insert --,-- and after "composite" insert --,--.

Signed and Sealed this

Twenty-eighth Day of June, 1994

Attest:

BRUCE LEHMAN

*Attesting Officer*          *Commissioner of Patents and Trademarks*